United States Patent
Doyle et al.

(10) Patent No.: US 6,362,082 B1
(45) Date of Patent: Mar. 26, 2002

(54) METHODOLOGY FOR CONTROL OF SHORT CHANNEL EFFECTS IN MOS TRANSISTORS

(75) Inventors: Brian S. Doyle, Cupertino; Brian Roberds, Santa Clara, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/342,030

(22) Filed: Jun. 28, 1999

(51) Int. Cl.[7] .......................................... H01L 21/265
(52) U.S. Cl. ...................................... 438/523; 438/301
(58) Field of Search ................................ 438/523, 243, 438/270, 267, 291, 301, 364–367, 370, 371

(56) References Cited

PUBLICATIONS

Lifetime control in silicon devices by voids induce by He ion implantantion. V. Raineri et al., J. Appl Phys 79 (12) Jun. 15 1996 pp9012–9016.*

Cavity Formation and impurity Gettering in He–Implanted, Follstaedt et al. Journal of Eelectronic Materials, vol. 25, No. 1. 1996. pp 151–157.*

Rare gas bubbles in muscovite mica implanted with xenon and kryton. j.Mater. Res, vol. 9, No. 12, Dec. 1994. pp.3095–3107.

Microstructure of Al203 and MgA1204 preimplanted with H, He, C and irradiated with Ar+oins*. Elsevier Science B.V. Journal of Nuclear Materials 209 (1994) pp. 191–203.

Density Reproduction: A Mechanism for Amorphization at High Doses. E.D. Specht, D.A. Walko, and S. J. Zinkle. Mat. Res. Soc. Symp. Proc. vol. 316. 1994 Materials Research Society. pp. 241–246.

Gas bubbles in glass melts under micogravity, Part 2, Helium diffusion. V. Jeschke and G.H. Frischat. Physics and Chemistry of Glasses vol. 28, No. 5, Oct. 1997. pp 177–182.

Modification Effects in Ion–implanted SiO2 Spin–on–Glass. N. Moriya, Y. Shacham–Diamond, R. Kalish. J. Electrochem. Soc. vol. 140, No. 5, May 1993. The Electrochemical Society, Inc. pp1442–1450.

Helium bubbles in silicon: Structure and optical properties. R. Siegele, G.C. Weatherly, H.K. Haugen, D. J. Lockwood, and L.M. American Institute of Physics. Appl. Phys. Lett. (11), 1Mar.13 1995. pp 1319–3449.

Helium–Induced Porous Layer Formation in SIlicon. A. Van Veen, C.C. Griffioien, and J.H. Evans. Material Research Society. Mat. Res. Soc. Symp. Proc. vol. 107. Mar. 1988. pp 449–454.

Lifetime control in silocon devices by voids induce by He ion implantation. V. Raineri, G. Fallica, and S. Libertino. J. Appl. Phys. 79 (12). Jun. 15 1996. 1996 American institute of Physics. pp 9012–9016.

Interaction of Cavitiesand Dislocations in Semiconductors. D.M. Follstaedt, S.M. Myers, S R. Lee, J.L. Reno, R.L. Dawson, and J. Han. Mat. Res. Soc. Symp. PRoc. vol. 438. 1997 Materials Research Society. pp 229–234.

Microstructural Properties of Helium Implanted Void Layers in Silicon as Related to Front–Side Gettering. J.W. Medernach, T.A. Hill, S.M. Myers, and T.J. Headly. J. Electrochem. Soc., Sol. 143, No. 2. Feb. 1996, pp 725–735.

(List continued on next page.)

Primary Examiner—David Nelms
Assistant Examiner—Dung A Le
(74) Attorney, Agent, or Firm—Blakely, Sokoloff, Taylor & Zafman LLP

(57) ABSTRACT

A method of improving short channel effects in a transistor. First, a substance is implanted in a substrate. The substrate is then annealed such that the implanted substance forms at least one void in the substrate. Then, a transistor having a source, a drain, and a channel region is formed on the substrate, wherein the at least one void is in the channel region of the transistor.

18 Claims, 7 Drawing Sheets

OTHER PUBLICATIONS

Cavity Formation and Inputirt Gettering in He–Implanted Si. D.M. Follstaedt, S.M. Myers, G.A. Petersen, and J.W. Medernach. Journal of Electronic Materials, vol. 25, No. 1. 1996. pp151–156.

Cavity and Nucleation and Evolution in He–Implanted Si and GaAs. D.M. Follstaedt, S.M. Myers, G.A. Petersen, and J.C. Barbour. Mat. Res. Soc. Symp., Proc. vol. 396. 1996 Materials Research Society. pp 801–806.

Radiation damage adn implanted He atom interaction during void formation. V. Raineri and Saggio. Appl. Phys. Lett. 71 (12), Sep. 1997. pp1673–1675.

* cited by examiner

METHODOLOGY FOR CONTROL OF SHORT CHANNEL EFFECTS IN MOS TRANSISTORS

RELATED APPLICATIONS

Applications related to the present invention include: "Method of Increasing the Mobility of MOS Transistors by Use of Localized Stress Regions", Ser. No. 09/340,583, filed Jun. 28, 1999; "Technique to Obtain Increased Channel Mobilities in NMOS Transistors by Gate Electrode Engineering", Ser. No. 09/340,950, filed Jun. 28, 1999; and "Method for Reduced Capacitance Interconnect System Using Gaseous Implants into the ILD", Ser. No. 09/344,918, filed Jun. 28, 1999. Each of the related applications listed above has been assigned to the Assignee of the present invention.

BACKGROUND OF THE INVENTION

1. Field of the Invention

A method of improving short channel effects is described. More particularly, the present invention involves the use of implants in the channel region of an MOS transistor to inhibit the lines of force from extending from the source to the drain of an MOS transistor.

2. Description of Related Art

FIG. 1 is a side cross-sectional view of an NMOS transistor 10 known in the art. A conventional transistor 10 generally includes a semiconductor generally comprising a silicon layer 16 having a source 20 and a drain 18 separated by a channel region 22. A thin oxide layer 14 separates a gate 12, generally comprising polysilicon, from the channel region 22. In the device 10 illustrated in FIG. 1, the source 20 and drain 18 are n+ regions having been doped by arsenic or phosphorous. The channel region 22 is generally boron doped. (Note that for both the source 20 and drain 18 regions and the channel region 22 other materials may also be used.) Fabrication of a transistor such as the device 10 illustrated in FIG. 1 is well-known in the art and will not be discussed in detail herein.

The speed or velocity (v) of the current through the channel region 22 is a function of the mobility ($\mu$) of the channel region, as expressed by the formula v=$\mu$E wherein E represents the electric field across the channel region 22. Because E is generally a constant value, the higher the carrier mobility ($\mu$) of a device the faster the device can function. As the demand for faster devices continually grows in the industry, the desire for a device having an increased mobility also increases. Thus, a method for fabricating a device having an increased carrier mobility would be desirable.

Another issue that arises when dealing with transistors of the present art involves current leakage from the source to the drain. One of the limiting factors in the scaling of transistors to smaller dimensions is the inability of the gate to fully control the channel region. As the source and drain junctions approach one another, the lines of force resulting from the potential applied to the drain terminate on the source junction, causing Drain-induced Barrier Lowering (DIBL). This DIBL results in leakage current between the source and drain, and at short enough channel lengths, results in failure of the device. Thus, a method of reducing current leakage would allow for the fabrication of transistors fabricated on a smaller scale.

SUMMARY OF THE INVENTION

A method of reducing short channel effects in a transistor is described. First, a substance is implanted in a substrate. The substrate is then annealed such that the implanted substance forms at least one void in the substrate. Then, a transistor having a source, a drain, and a channel region is formed on the substrate, wherein the at least one void is in the channel region of the transistor.

BRIEF DESCRIPTION OF THE DRAWINGS

The invention is further described by way of example with reference to the accompanying drawings, wherein.

DETAILED DESCRIPTION

A method of improving short channel effects in transistors through use of implants is described. In the following description, numerous specific details are set forth such as specific materials, process parameters, dimensions, etc. in order to provide a thorough understanding of the present invention. It will be obvious, however, to one skilled in the art that these specific details need not be employed to practice the present invention. In other instances, well-known materials or methods have not been described in detail in order to avoid unnecessarily obscuring the present invention.

One method of varying the carrier mobility of a transistor is by varying the bandgap. As the bandgap of a device decreases, the carrier mobility of the device increases. Likewise, as the bandgap of a device increases, the carrier mobility of the device decreases. Variation of the bandgap and hence variation of the carrier mobility of a transistor may be achieved by creating localized stresses across the different regions (i.e., source, drain, channel, and gate) of a transistor. Localized stresses in a substrate cause deformation of the substrate, which affects the size of the bandgap. It has been known for some time that in NMOS transistors, tensile (compressive) stresses cause increases (decreases) in mobility due to the sensitivity of the bandgap to stresses. Similarly, PMOS transistors show increases (decreases) in mobility due to compressive (tensile) stress. This change in mobility of a device arises due to energy level changes in the valance band caused by these stresses.

Figure 1:
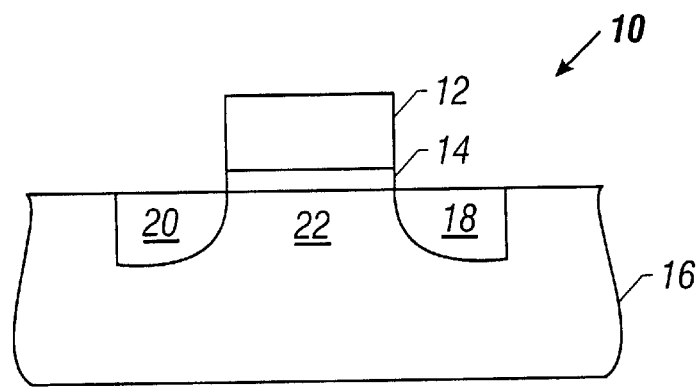
FIG. 1 is a side cross-sectional view of an NMOS transistor known in the art.
Figure 2A:
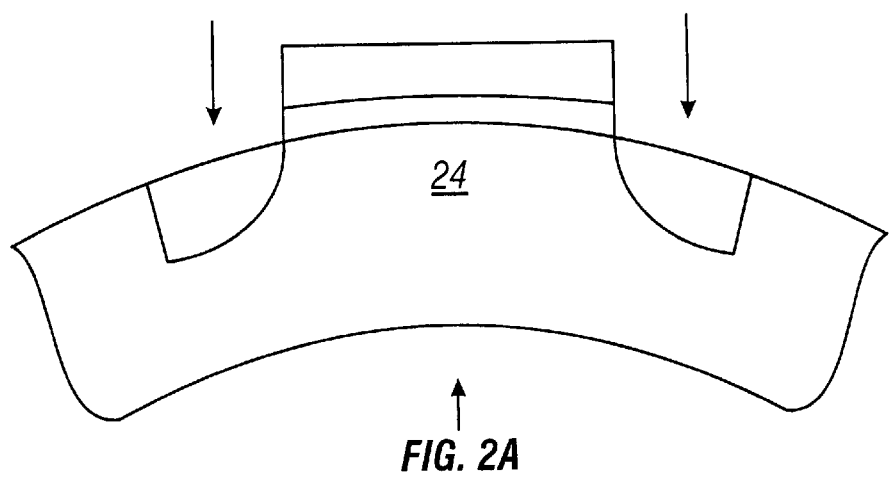
FIG. 2A is a side cross-sectional view of an MOS transistor under tensile stress.
Figure 2B:
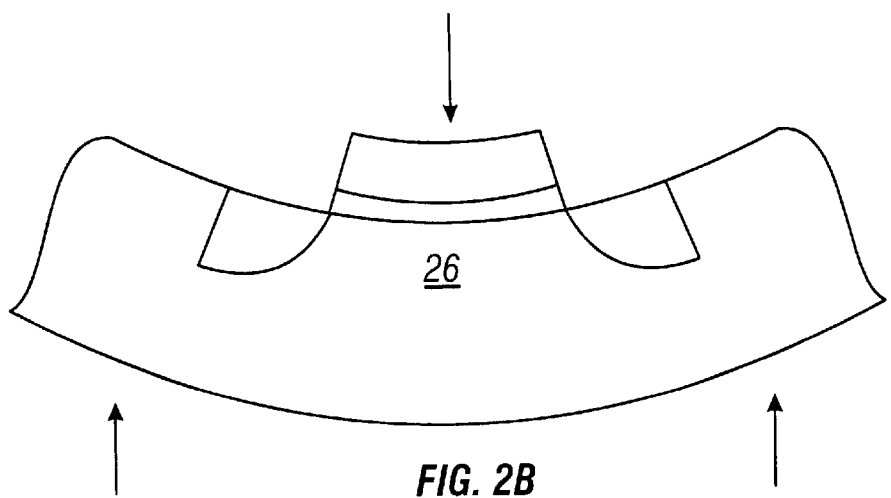
FIG. 2B is a side cross-sectional view of an MOS transistor under compressive stress.
Figure 3A:
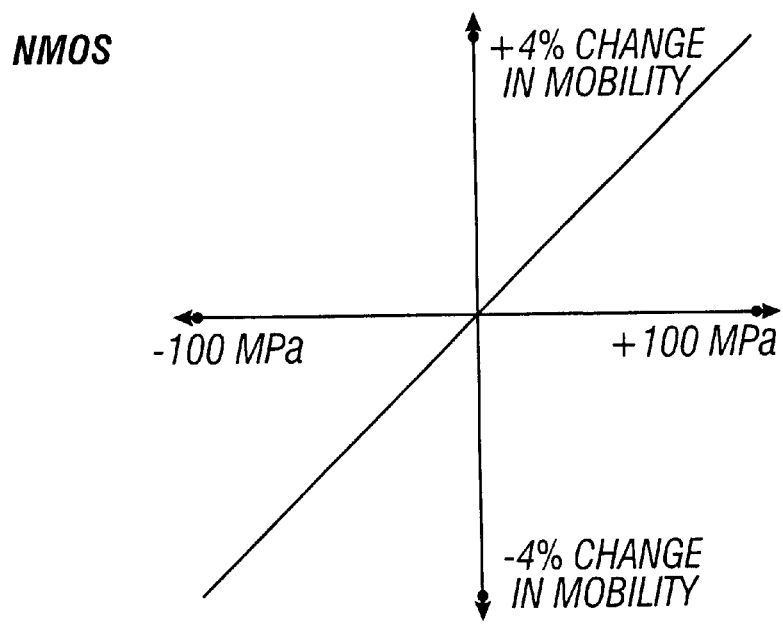
FIG. 3A is a graph illustrating the percent change in mobility of a transistor as a function of stress for an NMOS transistor.
Figure 3B:
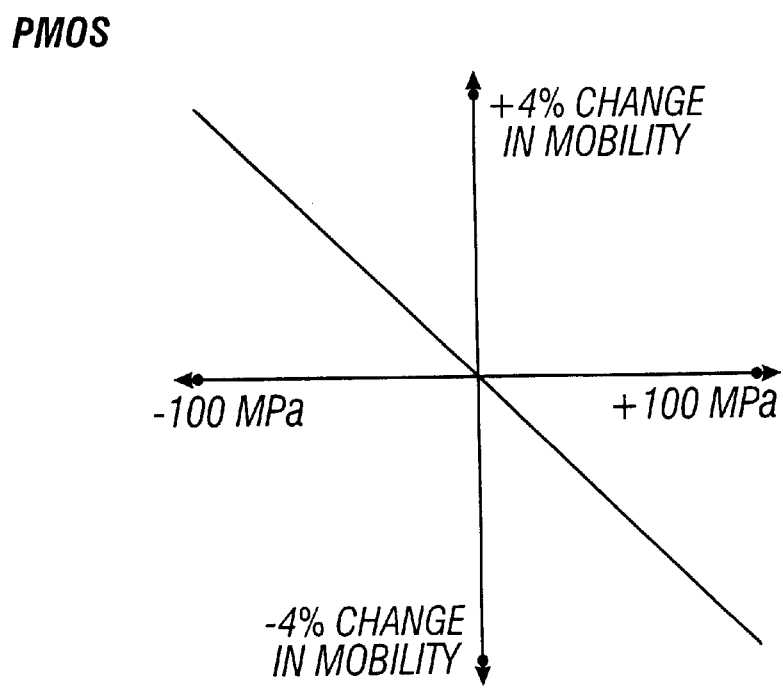
FIG. 3B is a graph illustrating the percent change in mobility of a transistor as a function of stress for a PMOS transistor.

FIG. 2A illustrates the NMOS transistor 10 (see FIG. 1) when a tensile stress is applied. The narrower channel region 24 results in a smaller bandgap and hence results an increased mobility. FIG. 2B illustrates the NMOS transistor 10 (see FIG. 1) when a compressive stress is applied. The larger channel region 26 results in a larger bandgap and hence a decreased mobility. Note that in both FIGS. 2A and 2B the amount of localized stress has been greatly exaggerated for illustrative purposes only. FIGS. 3A and 3B illustrate the dependence of a device's carrier mobility on the mechanical stress applied to the device. FIG. 3A illustrates this dependence for an NMOS device and FIG. 3B illustrates this dependence for a PMOS device. As illustrated in FIGS. 3A and 3B, the dependence of a device's mobility on stress has been quantified, wherein changes in mechanical stress of the order of approximately 100 MPa can result in mobility changes of the order of approximately 4%.

Figure 4:
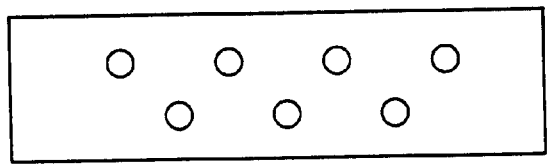
FIG. 4 is a side cross-sectional view of a substrate having gaseous implants.

One method of creating localized stresses in a semiconductor is through the implantation of a substance (e.g. a gas) into the silicon substrate. The implantation of gaseous substances into the substrate results in the formation of voids (also referred to as cavities, openings, or bubbles) within the substrate, as illustrated in FIG. 4. As the substrate undergoes subsequent processing, the implanted gaseous substance generally migrates or diffuses of the substrate, leaving behind a void in the substrate.

A method of forming voids in a region of a substrate to modify the localized stresses of the region such that the carrier mobility of a device fabricated on the substrate is also modified is described herein. By introducing a void in the substrate of a device, the substrate is strained such that it bends the band and in bending the band changes the mobility of the carriers. Recall from the previous discussion above, the carrier mobility of a device is representative of an electron's ability to move through the channel region of a device under a given field.

The voids of the present invention may be implanted into the substrate before, during, or after the formation of a device on the substrate. In one embodiment, however, the voids are implanted into a substrate prior to the formation of a device on the substrate. The substance to be implanted into the substrate may be any one of or a combination of several different gases, including but not limited to the noble gases. Oxygen or other implanted ions may also be used in reaction to alter the internal region of the substrate by way of specific volume or thermal expansion differences (e.g., oxidized voids). In one embodiment of the present invention, helium is the gaseous substance implanted into the substrate of the to-be-formed device. For illustrative purposes only, the following embodiments of the present invention will be discussed with use of helium-formed voids.

The implantation of voids into a substrate is known and will not be discussed in detail herein. Thus, a conventional implanter may be used to implant the substance into the substrate. In one embodiment of the present invention, the implantation is performed at an energy of approximately 30 keV (kilo electron volts) and a dosage of approximately $10^{16}$ to $10^{17}$ atoms/cm$^2$. In this embodiment, the depth of the implantation into the substrate is approximately 2000 Å. Note that the depth of the implantation is controlled by the energy of the implant and may be modified as required by the size of a given device.

As the substance is introduced into the substrate, damage is caused by the substance to the substrate causing an amorphization of the lattice at the implant depth. The damage to the substrate may include vacancies, interstitials, dislocations, stacking faults, etc.. As the substrate is annealed at approximately 400–500° C. and for approximately 30 seconds, the damage to the substrate begins to anneal away and the formation of voids in the substrate begins. In one embodiment of the present invention, the voids are approximately 10–20 nm wide when annealed at approximately 600° C. As the annealing temperature increases, the smaller voids become smaller and eventually disappear, and the larger voids become larger. For example, in one embodiment of the present invention, the remaining voids are approximately 50 nm when annealed at approximately 1100° C. These voids can cause localized stresses of approximately 1 GPa.

Figure 5:
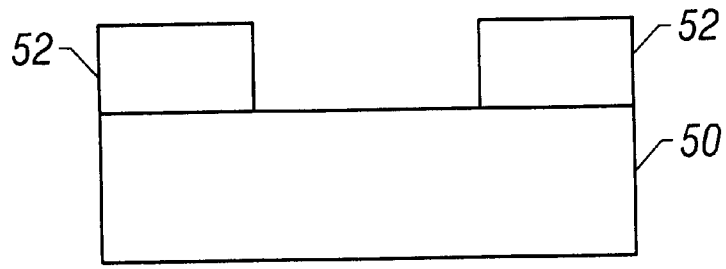
FIG. 5 is a side cross-sectional view of a substrate with a mask wherein the channel region of an NMOS device to be formed is exposed.
Figure 6:
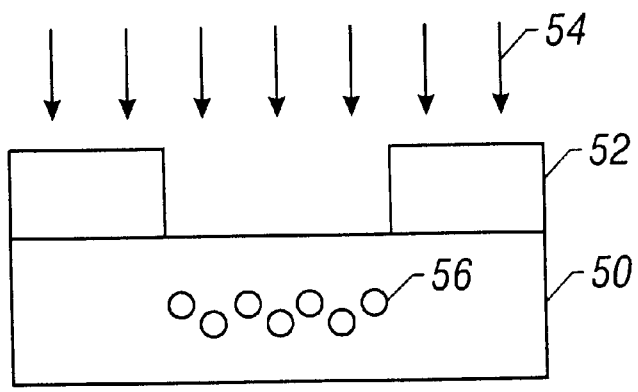
FIG. 6 is a side cross-sectional view of the substrate of FIG. 5 undergoing gaseous implantation.
Figure 7:
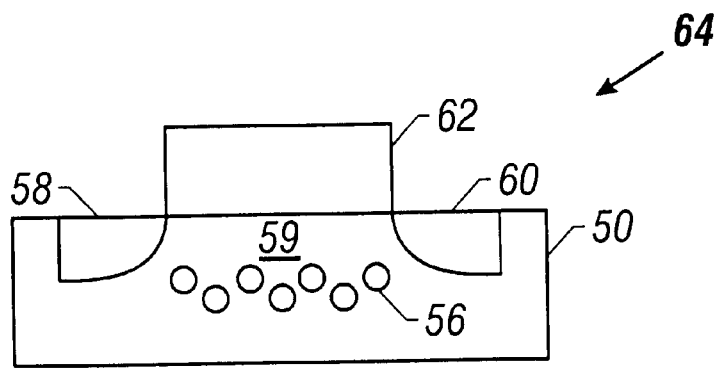
FIG. 7 is a side cross-sectional view of the NMOS device of FIGS. 5 and 6 with voids in the channel region creating a tensile stress.

In one embodiment of the present invention, helium-formed voids are implanted in the channel region of an NMOS device as illustrated in FIGS. 5–7. First, a mask 52 is formed on a substrate 50 using conventional photoresist techniques, such that the region of the substrate 50 that will eventually be the channel region of NMOS device is exposed (see FIG. 5). Then, helium is implanted to form voids 56 in the exposed region following the above described process and as illustrated in FIG. 6. Once the helium has been implanted, the mask 52 is removed and an NMOS device 64 shown in FIG. 7 is formed on the substrate 50 having a source 58, a drain 60, and a gate 62 with a channel region 59 under a localized stress. The resulting NMOS device 64 thus has an increased carrier mobility due to the tensile stresses on the device.

Figure 8:
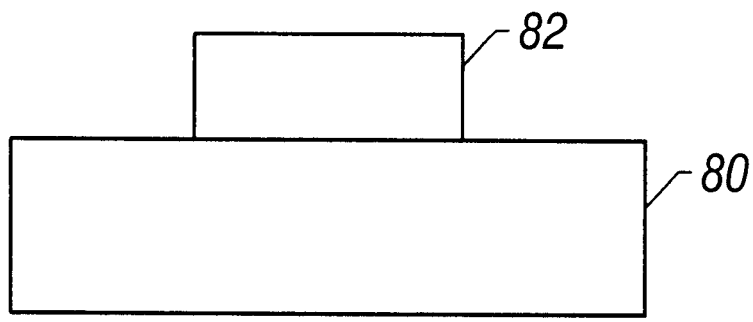
FIG. 8 is a side cross-sectional view of a substrate with a mask wherein the source and drain regions of a PMOS device to be formed are exposed.
Figure 9:
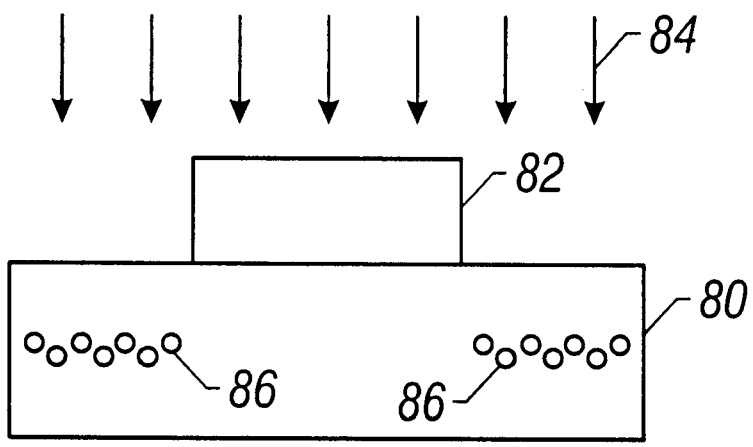
FIG. 9 is a side cross-sectional view of the substrate of FIG. 8 undergoing gaseous implantation.
Figure 10:
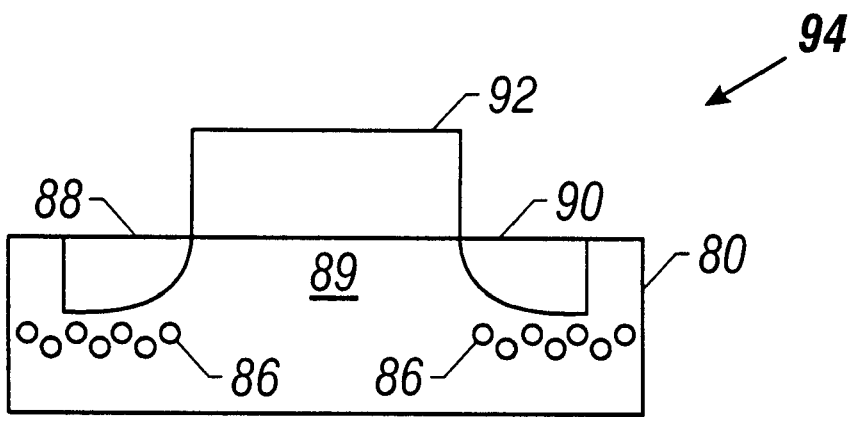
FIG. 10 is a side cross-sectional view of the PMOS device of FIGS. 8 and 9 with voids in the source and drain regions creating a compressive stress.

In a second embodiment of the present invention, a similar procedure is followed to create a PMOS device having helium-formed voids in the source and drain regions of the device, as illustrated in FIGS. 8–10. First, a mask 82 is formed on a substrate 80 using conventional photoresist techniques, such that the regions of the substrate 80 that will eventually be the source and drain of a PMOS device are exposed (see FIG. 8). Then, helium is implanted to form voids 86 in the exposed region following the above described process and as illustrated in FIG. 9. Once the voids 96 have been formed, the mask 82 is removed and a PMOS device 94 is formed on the substrate 80 having a source 88, a drain 90, a gate 92, and a channel region 89. The source 88 and drain region 90 are now under a localized stress resulting in a PMOS device 94 having an increased carrier mobility due to the compressive stresses on the device.

Figure 11:
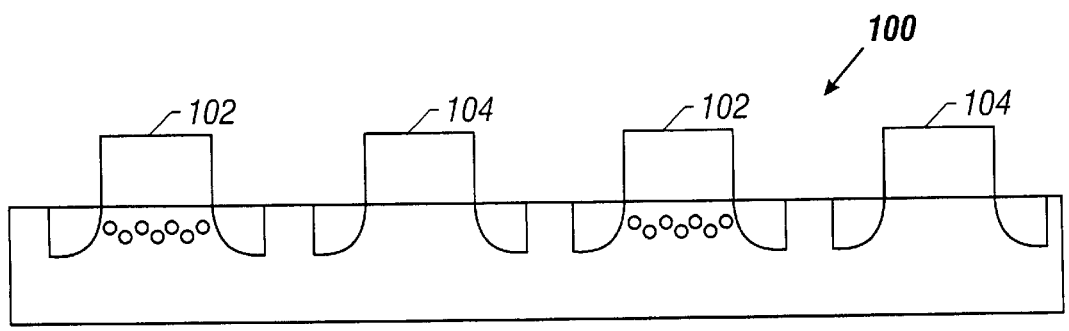
FIG. 11 is a side cross-sectional view of an MOS device having NMOS devices under tensile stress and PMOS devices under compressive stress.

As discussed above, NMOS devices have an increased carrier mobility when placed under a tensile stress and PMOS devices have an increased carrier mobility when placed under a compressive stress. A problem arises when the entire substrate is put under a tensile (compressive) stress, since the NMOS (PMOS) device's mobility will increase while the PMOS (NMOS) device's mobility will decrease. Thus, a third embodiment of the present invention involves placing the portion of a substrate to be used in an NMOS device under a tensile stress. This causes the remaining portion of the substrate, the portion to be used as a PMOS device, to be under a compressive stress. In this manner, the carrier mobility of both types of MOS devices may be increased even when formed from a single substrate. FIG. 11 illustrates a device 100 containing both NMOS devices 102 and PMOS devices 104. Voids are formed in the channel region of the NMOS devices 102. The voids create localized stresses such that the NMOS devices 102 are under a tensile stress and the PMOS devices 104 are under a compressive stress. Thus, both types of devices 102 and 104 have an increased carrier mobility.

Figure 12:
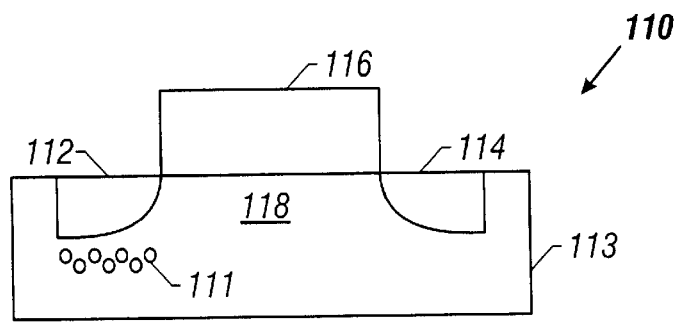
FIG. 12 is a side cross-sectional view of an MOS device having a graded stress effect created by the presence of voids in the source region.

A fourth embodiment of the present invention creates an MOS device having a grading effect. One example of an MOS device 110 having a grading effect is illustrated in FIG. 12. In the same manner as that described above, voids 111 have been formed in the substrate 113. In this embodiment, however, the voids are formed solely below the source region 112 of the device 110. In this manner, the band structure at the source region 112 is placed under a tensile stress and the drain region 114 is placed under a compressive stress. Grading a transistor in this manner can create a device 110 that has greater drive current due to increased injection of carriers at the source end resulting from the band distortion induced by the voids.

Figure 13:
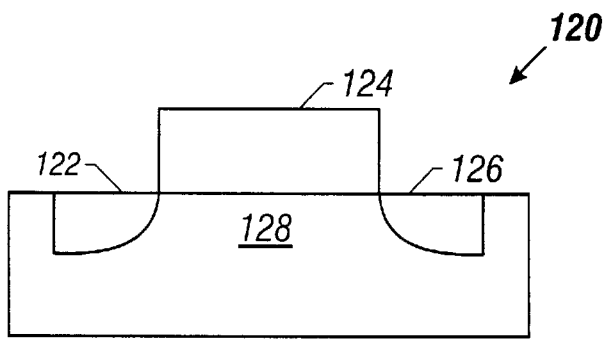
FIG. 13 is a side cross-sectional view of an NMOS device fabricated using conventional methods known in the art.
Figure 14:
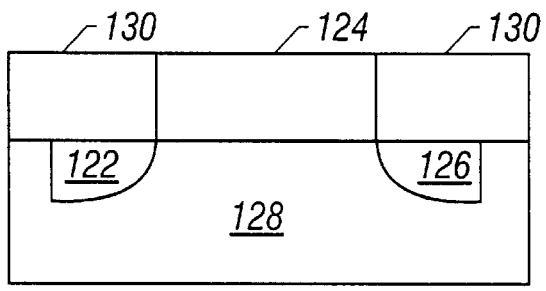
FIG. 14 is a side cross-sectional view of the NMOS device of FIG. 13 with a mask leaving solely the gate exposed.
Figure 15:
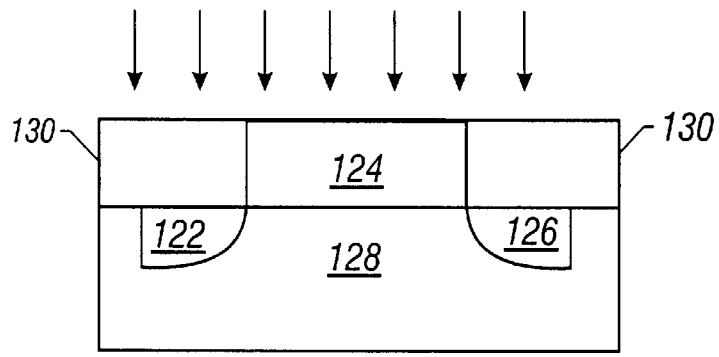
FIG. 15 is a side cross-sectional view of the NMOS device of FIG. 14 during gaseous implantation.
Figure 16:
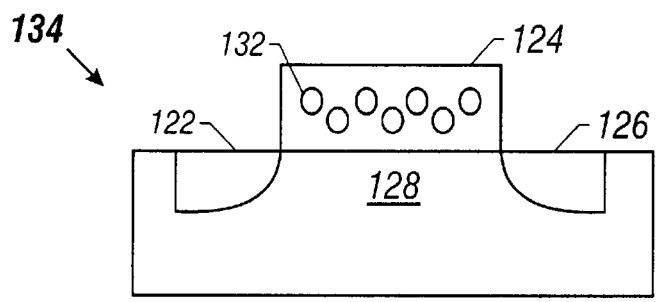
FIG. 16 is a side cross-sectional view of the NMOS device of FIG. 15 with gaseous implants in the gate creating a tensile stress in the device.

Another embodiment illustrated in FIGS. 13–16 shows an alternative method of using voids to create a tensile stress in an NMOS device. FIG. 13 illustrates an NMOS device 120 having a source 122, a gate 124, a drain 126, and a channel region 128. The NMOS device 120 may be formed using conventional methods known in the art. After the NMOS device 120 is formed, a conventional photoresist mask 130 is applied to the device 120 such that only the gate region 124 is exposed (see FIG. 14). Next, as shown in FIG. 15, voids 132 are formed in the gate 124 (note that the gate 124 may be either polysilicon or metal).

As above, the substance to be implanted into the gate may be any one of or a combination of several different gases, including but not limited to the noble gases. Oxygen or other implanted ions may also be used in reactions to alter the internal regions of the gate by way of specific volume or thermal expansion differences (e.g., oxidized voids). In one embodiment, argon is the substance implanted into the gate 124 of the NMOS transistor 120. In one embodiment, the implantation is performed at an energy of approximately 10 keV and a dosage of approximately $10^{16}$ to $10^{17}$ atoms/cm$^2$, commensurate with an implant depth approximately half way down into the gate, or approximately 1000Å. The device 120 is then annealed for approximately 30 seconds at at least 400° C. The implant and annealing process steps may be performed either before the gate is etched or after. If performed after, it may be necessary to protect the source 122 and drain 126 regions with the mask 130 as shown. When the mask 130 is removed (see FIG. 16), an NMOS device 134 under a tensile stress caused by the voids in the gate 124 is revealed and has an increased carrier mobility as compared to the NMOS device 120 of FIG. 13.

Each of the above embodiments has utilized implantations to modify the mechanical stresses acting on an MOS device. By modifying the stresses acting upon an MOS device, the present invention provides MOS devices having an increased carrier mobility. In this manner, the speed of MOS devices may be improved.

Other uses of implants in the substrate of an MOS transistor are also significantly advantageous. For example, one of the limiting factors in the scaling of transistors to smaller dimensions is the inability of the gate to fully control the channel region. As the source and drain junctions approach one another, the lines of force resulting from the potential applied to the drain terminate on the source junction, causing Drain-Induced Barrier Lowering (DIBL). This DIBL results in leakage current between the source and drain, and at short enough channel lengths, results in failure of the device. One approach to limiting this parasitic effect is in use of punch-through implants and Halo implants to control the amount the barrier is lowered between the source and drain.

Figure 17:
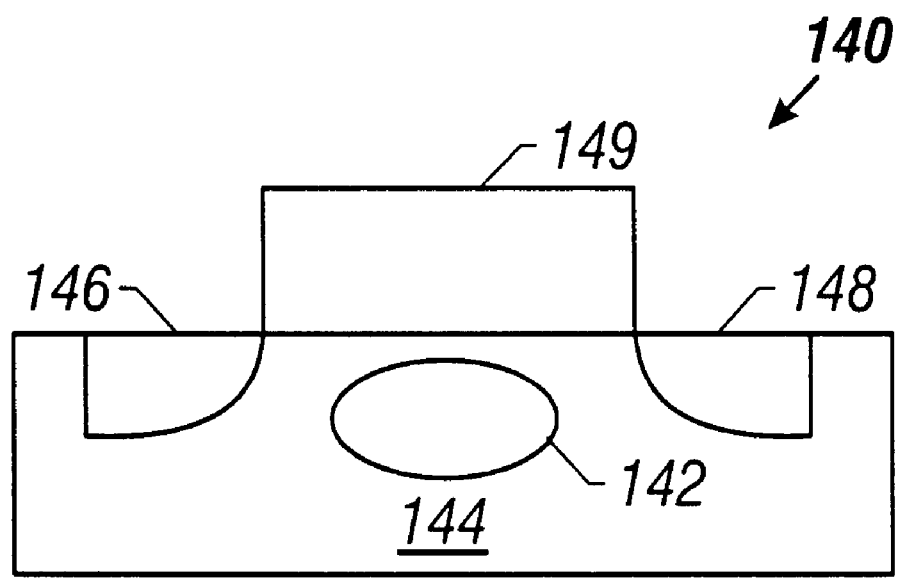
FIG. 17 is a side cross-sectional view of an MOS device with a void in the channel region acting as a barrier to reduce current leakage.
Figure 18:
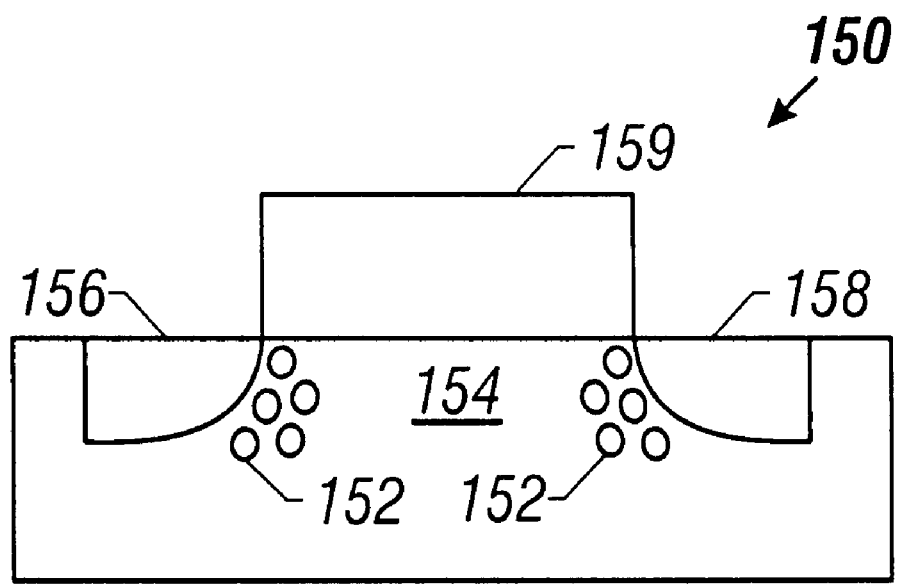
FIG. 18 is a side cross-sectional view of an MOS device with a plurality of voids near the source and drain regions along the outer portion of the channel that act as a barrier to reduce current leakage.

One use of the voids described above is to create a region between the source and drain that effectively inhibits the lines of force from the drain terminating at the source junction as shown in FIG. 17. A large single void 142 may be formed in the channel region 144 below the gate 149 of an MOS transistor 140 to effectively reduce leakage current between the source 146 and the drain 148. An alternative embodiment achieves this same purpose of reducing leakage current through use of several smaller voids 152 formed at the outer edges of the channel region 154 below the gate 159 and near the source 156 and drain 158 regions, as shown in device 150 of FIG. 18. In this manner, more competitive transistors may be designed since short channel effects will be reduced and, as a result, devices may be fabricated having a shorter channel length.

Note that the voids 142 and 152 used to inhibit the lines of force from the drain terminating at the source junction are formed by the same process as that described above with respect to the voids used to increase mobility. In fact, the same voids can act both as mobility enhancers and punch-through inhibitors. However, the placement of voids used as punch-through inhibitors in the substrate is more critical than voids used to induce localized stress regions. Typically, the punch-through inhibitor voids are implanted at approximately 1000Å into the substrate. The voids in the silicon act to reduce short channel effects (a very local effect). As the stress increases, the mobility of carriers further and further from the voids are affected, eventually reaching all the way up to the invasion layer. Thus, the punch-through inhibitor voids are generally closer to the channel than the mobility voids, and the mobility voids can be further away as long as the stresses are large enough to influence the mobility at the surface or channel region.

We claim:

1. A method to improve a short channel effect in a transistor comprising:
    implanting a substance in a substrate;
    annealing said substrate such that said implanted substance forms a void in said substrate; and,
    forming a transistor on said substrate, in which a channel region of said transistor includes said void to inhibit lines of force from a drain of said transistor from terminating at a source of said transistor.

2. The method of claim 1 wherein implanting said substance further comprises implanting said substance selected from the group consisting of the noble gases, oxygen, and any combination thereof.

3. The method of claim 1 wherein implanting said substance further comprises implanting at an energy level of approximately 30 keV.

4. The method of claim 3 wherein implanting said substance further comprises implanting a gaseous substance at a dosage of approximately $10^{16}$ to $10^{17}$ atoms/cm$^2$.

5. The method of claim 1 wherein said step of annealing said substrate further comprises annealing at a temperature of at least 400° C.

6. The method of claim 5 wherein annealing said substrate further comprises annealing for at least 30 seconds.

7. The method of claim 1 wherein annealing said substrate further comprises annealing at a temperature of approximately 1100° C.

8. The method of claim 7 wherein annealing said substrate further comprises annealing for at least 30 seconds.

9. The method of claim 1 wherein said void is located approximately in a center of said channel region.

10. The method of claim 9 wherein said void provides termination for said lines of force to reduce leakage current between said source and said drain.

11. The method of claim 1 in which a plurality of voids are formed in said channel region.

12. The method of claim 11 wherein said voids are located in said channel region adjacent said source and said drain.

13. The method of claim 12 wherein said voids provide termination for said lines of force to reduce leakage current between said source and said drain.

14. A method to improve a short channel effect in a transistor comprising:

implanting a gaseous substance in a substrate;

annealing said substrate such that said implanted gaseous substance forms a void in said substrate;

forming a transistor on said substrate, in which a channel region of said transistor includes said void to inhibit lines of force from a drain of said transistor from terminating at a source of said transistor; and, having said void provide a barrier for said lines of force between said source and said drain to reduce leakage current.

15. The method of claim 14 wherein implanting said gaseous substance further comprises implanting said gaseous substance selected from the group consisting of the noble gases, oxygen, and any combination thereof.

16. The method of claim 14 wherein implanting said gaseous substance further comprises implanting at an energy level of approximately 30 KeV.

17. The method of claim 16 wherein implanting said gaseous substance further comprises implanting a gaseous substance at a dosage of approximately $10^{16}$ to $10^{17}$ atoms/cm$^2$.

18. The method of claim 14 wherein annealing said substrate further comprises annealing at a temperature of at least 400° C.

* * * * *